Figure 1:
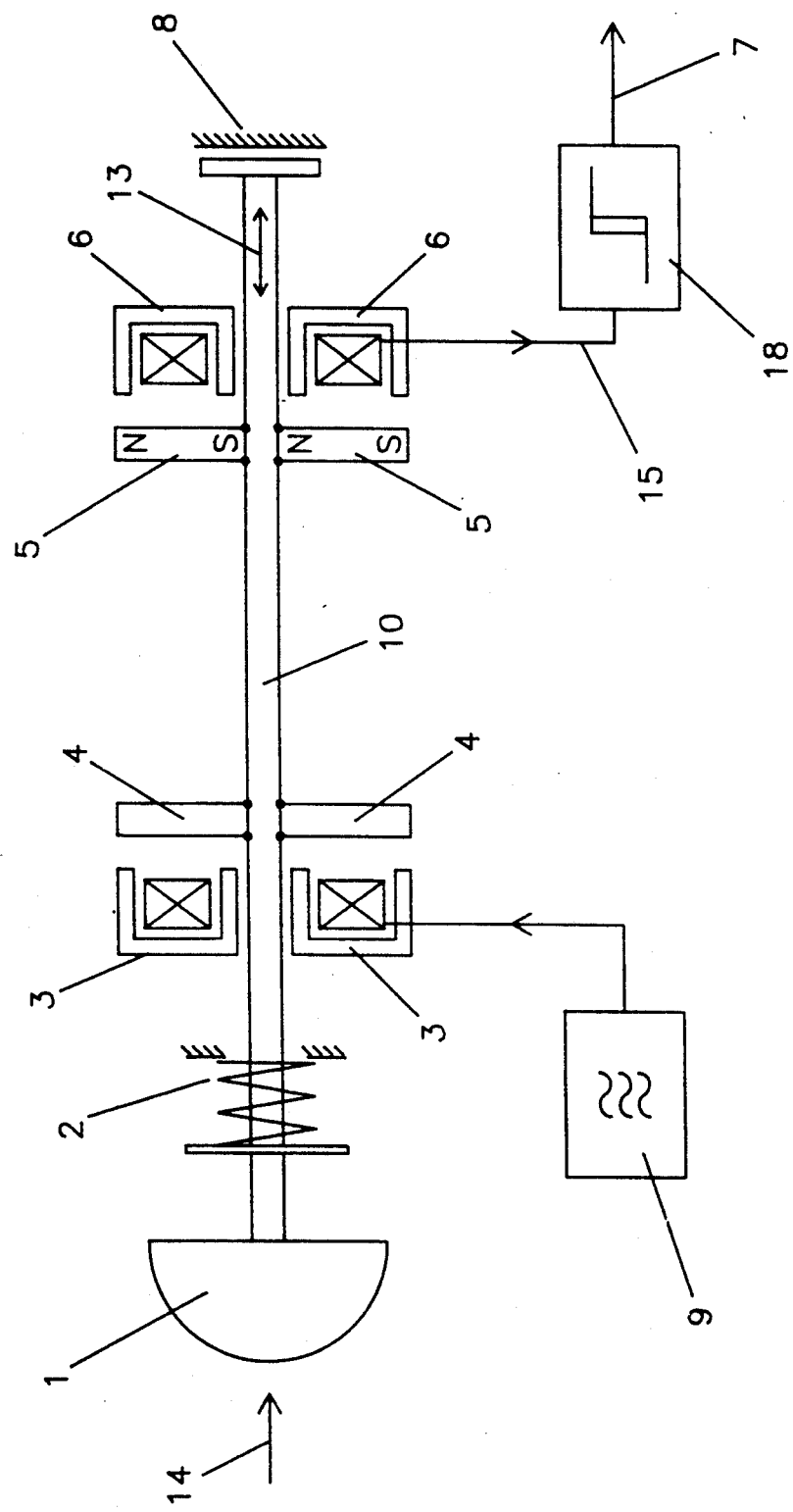

United States Patent [19]
Both

[11] Patent Number: 5,197,321
[45] Date of Patent: Mar. 30, 1993

[54] CONTROL DEVICE WITH MONITORED OPERATING ELEMENT

[76] Inventor: Helmut Both, Gartenstrasse 4, D-6501 Ludwigshöhe, Fed. Rep. of Germany

[21] Appl. No.: 646,754
[22] PCT Filed: May 3, 1990
[86] PCT No.: PCT/DE90/00317
 § 371 Date: Jan. 3, 1991
 § 102(e) Date: Jan. 3, 1991
[87] PCT Pub. No.: WO90/13822
 PCT Pub. Date: Nov. 15, 1990

[30] Foreign Application Priority Data

May 4, 1989 [DE] Fed. Rep. of Germany ....... 3914704

[51] Int. Cl.⁵ ............................................. G01P 21/00
[52] U.S. Cl. ..................................................... 73/1 D
[58] Field of Search ............. 73/865.3, 582, 570, 73/2, 668, 1 D, 1 DV, 517 R, 517 AV; 200/61, 48

[56] References Cited

U.S. PATENT DOCUMENTS

| | | | |
|---|---|---|---|
| 3,045,476 | 7/1962 | Bell | 73/668 |
| 3,100,292 | 8/1963 | Warner, Jr. et al. | 73/517 R |
| 3,100,393 | 8/1963 | Bell | 73/668 |
| 3,224,245 | 12/1965 | Alibrandi et al. | 73/1 D |
| 3,768,832 | 10/1973 | Schmidt | 73/517 AV |
| 3,830,091 | 8/1974 | Sinsky | 73/1 D |
| 3,937,913 | 2/1976 | Soulas et al. | 200/302 |
| 4,644,315 | 2/1987 | Hodges | 73/862.65 |
| 4,754,644 | 7/1988 | Valentini | 73/517 R |

FOREIGN PATENT DOCUMENTS

| | | | |
|---|---|---|---|
| 1231430 | 5/1986 | U.S.S.R. | 73/570 |
| 1254393 | 8/1986 | U.S.S.R. | 73/1 D |
| 1495652 | 7/1989 | U.S.S.R. | 73/865.3 |

Primary Examiner—Robert Raevis
Attorney, Agent, or Firm—Robert P. Simpson; Michael L. Dunn

[57] ABSTRACT

The invention proposes a control device having a monitored operating element (1, 10). The operating element is used for introducing and forwarding an input command (14) to control systems, particularly of machines, plant or the like. In this arrangement, an oscillating movement (13) is imparted to the operating element by a drive (3, 4), which is constructed, for example, as a magnetic system, which movement is detected by the control system, particularly by means of a sensor (5, 6) which can also be constructed as an electromagnetic system. If an input command (14) is introduced into the operating element, it experiences a restriction in mobility by coming to rest against a fixed stop (8), so that no or only a smaller signal is introduced into the sensor and thus the control system. The same effect occurs if the mobility is reduced unintentionally by internal or external influences such as corrosion in the bearing points, fracture of the operating element and so forth.

10 Claims, 2 Drawing Sheets

CONTROL DEVICE WITH MONITORED OPERATING ELEMENT

The invention relates to a control device having a movable operating element for introducing and forwarding an input command to control systems, particularly of machines, plant or the like Most of the control devices which can be found on the market convert the input commands introduced into their operating element, for example push buttons, switching bar, switching plate and so forth into other physical quantities such as electrical signals, pressures, flows and the like which are then forwarded in this form to control systems, particularly of machines or plant.

If the mechanically movable operating element or if movable parts forming a functional unit with the latter (which are also designated as operating element in the text which follows), such as internal plungers, levers and so forth of such control devices are blocked without being noticed or if they lose adequate mobility as result of jamming, corrosion in the bearings, wedging or other influences, an input command introduced will not be accepted and, in consequence, also not be forwarded and processed. This is particularly hazardous if these are commands for stopping or for preventing the starting of machines and plant.

It is the object of the invention to design a control device with operating element in which the mobility of the mechanically movable operating element is continuously automatically monitored and when adequate mobility is lost, the same output signal is generated which would also be generated by the introduction of an input command in undisturbed operation.

The object is achieved by the fact that an oscillating movement is imparted to the operating element by a drive, this movement is forwarded by the operating element to a sensor and is detected by the latter, in which arrangement the introduction of an input command damps the oscillating movement According to the invention, a continuous oscillating movement of a particular amplitude is imparted by a suitable drive to the operating element to be mechanically moved by the input command for as long as no input command is introduced and adequate mobility exists. In this arrangement, for example, a magnetic system can be used as a drive which consists, in particular, of an electromagnet and an armature connected to the movable operating element. Similarly, pneumatic, hydraulic, capacitive or piezoelectric forms of drive are conceivable In this arrangement, the direction of the movement, which is dependent on the input command relative to the oscillating movement, can be arbitrary.

The oscillating movement of the mechanically movable operating element is appropriately detected by a suitable sensor, for example an electromechanically, pneumatically, hydraulically, capacitively, piezoelectrically or otherwise acting system and emitted as sensor signal which, for example after discrimination in an amplitude discriminator, can be emitted as binary output signal to the subsequent control system of the machine or plant.

The drive can be fed with external excitation by its own oscillator or with self-excitation by feeding back the sensor signal into the drive.

If an input command is introduced into the operating element, it is subjected itself (and all oscillating components of it), for example by coming to rest against a friction surface or a fixed stop, to a restriction of mobility, so that no signal or only a small signal is introduced into the sensor. This damping can also be effected additionally or only by emitting vibration energy into the medium introducing the input command, for example, the hand of a person or the rising of a fluid, whereby the medium surrounding the operating element changes from gaseous to liquid; the same effect occurs if the mobility is reduced unintentionally by internal or external influences such as corrosion in the bearing points, fracture of the parts carrying the mechanically movable operating element, such as springs and so forth.

The reduction in the amplitude of the sensor signal thus caused indicates that the operating element has been loaded by an introduced input signal or another disturbance occurring in the device or its supply, as a result of which an output signal is triggered.

The control device can be followed by a threshold switch (amplitude discriminator) which discriminates the falling of the amplitude emitted by the sensor below a predetermined value and converts it into a useable output signal.

Further features of the invention are represented in the subclaims and the description of the figures, it being noted that all individual features and all combinations of individual features are essential to the invention.

Figure 2:
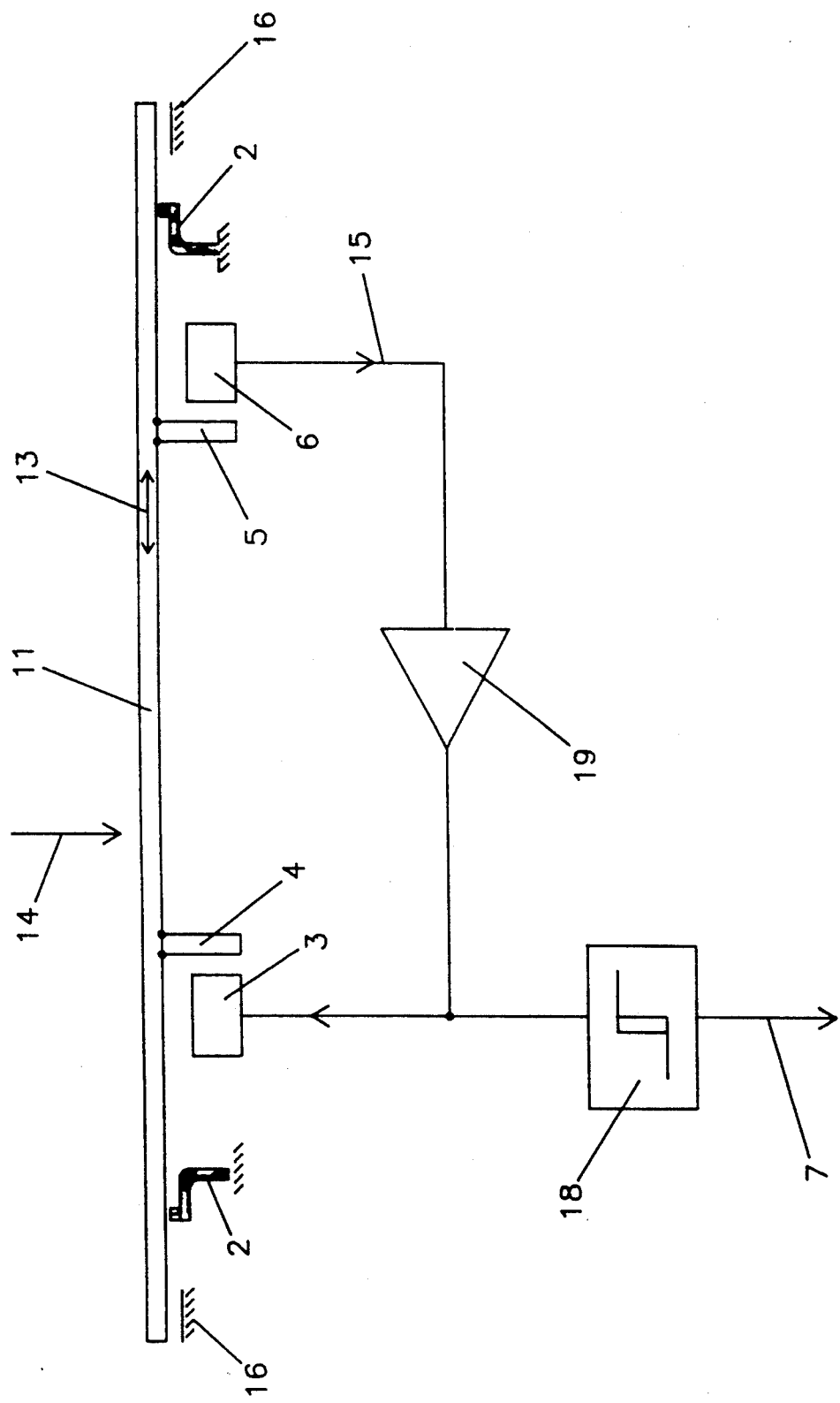

The invention is shown by way of example with reference to two embodiments, without being restricted to these, in the figures, in which:

FIG. 1 shows a diagrammatic representation of the construction and arrangement of the essential features of a first embodiment of the control device according to the invention with monitored operating element and FIG. 2 shows a corresponding representation of a second embodiment.

FIG. 1 shows an operating element which consists of a push button 1 and an internal plunger 10 which is firmly connected with the former. The internal plunger 10 is supported via bearing elements, not shown in greater detail, in such a manner that it can only perform a to and fro movement in the direction of its longitudinal axis. The plunger 10 is connected to a armature 4 which acts in conjunction with an electromagnet 3, electromagnet 3 and armature 4 representing the drive of the operating element. The plunger 10 is also firmly connected to a permanent magnet 5 which operates in conjunction with a stationary electromagnet 6, the permanent magnet 5 and the electromagnet 6 together representing a sensor The drive fed by means of its own oscillator 9 imparts a continuous oscillating movement 13 of particular amplitude to the operating element for as long as no input command 14 is introduced and adequate mobility exists. In this connection, the input command 14 has the same direction as the oscillating movement 13 of the operating element. This oscillating movement is detected by the sensor and emitted as sensor signal 15 which, after discrimination in an amplitude discriminator 18, is emitted as binary output signal 7 to a subsequent control system of a machine or plant.

If an input command 14 is introduced into the operating element, that is to say into the push button 1, itself and also the internal plunger 10 are subjected to a restriction in mobility by coming to rest against a fixed stop 8, so that no or only a small signal is introduced into the sensor. The same effect occurs if the mobility is unintentionally reduced by internal or external influences such as corrosion in the bearing points, fracture of the plunger 10 or of a spring 2 arranged between a stationary stop and a plate connected to the plunger 10. The reduction in amplitude of the sensor signal 15 thus caused indicates that the push button 1 is loaded by an introduced input command 14 or another disturbance occurring in the device or its supply, as a result of which the output signal 7 is triggered.

Parts of the control device shown in FIG. 2 which correspond to those in FIG. 1 with respect to their function are designated by the same reference numbers for the sake of simplicity. The control device shown in FIG. 2 shows an operating element which is constructed as switching plate 11. In the driven state of the switching plate 11, the oscillating movement 13 occurs there perpendicularly to the direction of an input command 14. Furthermore, the drive is self-excited in that the sensor signal 15 is supplied via an amplifier 19 not only to the amplitude discriminator 18 but also to the electromagnet 3. If an input command 14 is introduced into the switching plate 11, the latter is also subjected to a restriction in mobility by coming to rest against friction surfaces 16 in such a way that in accordance with what has been described before, nor or only a smaller signal is introduced into the sensor.

I claim:

1. A control device having a movable operating element for introducing and forwarding an input command to control systems of machines or plant, characterized in that an oscillating movement (13) is imparted to the operating element (1,10,11) by a drive (3,4), this movement is forwarded by the operating element (1,10,11) to a sensor (5,6) and is detected by the latter, in which arrangement the introduction of an input command (14) damps the oscillating movement (13), wherein the operating element is constructed of several parts, and wherein the operating element possesses a push button and a button rod connected to the latter, the button rod being connected at the drive end to an armature and at the sensor end to a permanent magnet.

2. A control device according to claim 1, characterized in that the damping expresses itself in a reduction of the amplitude of the oscillating movement (13) detected by the sensor (5, 6) and after processing by an amplitude discriminator (18), is emitted as binary output signal (7).

3. A control device according to claim 2, characterized in that the drive is constructed as a magnetic system which consists of an electromagnet and an armature connected to the operating element.

4. A control device according to claim 2, characterized in that the sensor is constructed as an electromechanical system which consists of an electromagnet and a permanent magnet (5) connected to the operating element.

5. A control device according to claim 2, characterized in that the drive is fed with external excitation by its own oscillator.

6. A control device according to claim 1, characterized in that the drive is constructed as a magnetic system which consists of an electromagnet and an armature connected to the operating element.

7. A control device according to claim 6, characterized in that the sensor is constructed as an electromechanical system which consists of an electromagnet and a permanent magnet (5) connected to the operating element.

8. A control device according to claim 6, characterized in that the drive is fed with external excitation by its own oscillator.

9. A control device according to claim 1, characterized in that the sensor is constructed as an electromechanical system which consists of an electromagnet and a permanent magnet (5) connected to the operating element.

10. A control device according to claim 1, characterized in that the drive is fed with external excitation by its own oscillator.

* * * * *